US010381052B2

(12) United States Patent
Pilo et al.

(10) Patent No.: US 10,381,052 B2
(45) Date of Patent: Aug. 13, 2019

(54) OVERVOLTAGE PROTECTION FOR A FINE GRAINED NEGATIVE WORDLINE SCHEME

(71) Applicant: INTERNATIONAL BUSINESS MACHINES CORPORATION, Armonk, NY (US)

(72) Inventors: Harold Pilo, Underhill, VT (US); Richard S. Wu, Winooski, VT (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 37 days.

(21) Appl. No.: 15/899,863

(22) Filed: Feb. 20, 2018

(65) Prior Publication Data

US 2018/0174645 A1  Jun. 21, 2018

Related U.S. Application Data

(63) Continuation of application No. 15/797,068, filed on Oct. 30, 2017, now Pat. No. 9,953,698, which is a continuation of application No. 14/962,290, filed on Dec. 8, 2015, now Pat. No. 9,881,666, which is a continuation of application No. 14/450,811, filed on Aug. 4, 2014, now Pat. No. 9,318,162.

(51) Int. Cl.
  *G11C 11/00* (2006.01)
  *G11C 5/14* (2006.01)
  *G11C 11/417* (2006.01)
  *G11C 8/08* (2006.01)
  *G11C 11/418* (2006.01)

(52) U.S. Cl.
  CPC .............. *G11C 5/147* (2013.01); *G11C 8/08* (2013.01); *G11C 11/417* (2013.01); *G11C 11/418* (2013.01); *G11C 5/14* (2013.01)

(58) Field of Classification Search
  CPC ...... G11C 5/147; G11C 11/417; G11C 11/418; G11C 8/09; G11C 5/14
  USPC ............................................. 365/154
  See application file for complete search history.

(56) References Cited

U.S. PATENT DOCUMENTS 5,969,542 A    10/1999  Maley et al.
6,611,451 B1   8/2003   Houston
(Continued)

OTHER PUBLICATIONS

Elgomati, et al. "statistical optimization for process parameters to reduce variability of 32 nm PMOS transistor threshold voltage", International Journal of the Physical Sciences vol. 6(10), May 18, 2011, pp. 2372-2379.
(Continued)

*Primary Examiner* — Xiaochun L Chen
(74) *Attorney, Agent, or Firm* — Steven Meyers; Andrew M. Calderon; Roberts Mlotkowski Safran Cole & Calderon, P.C.

(57) ABSTRACT

A fine grained negative wordline scheme for SRAM memories is disclosed. The scheme includes a circuit having a static random access memory (SRAM) cell including at least a wordline coupled to a plurality of NFETs of a transistor array. The circuit further includes a wordline driver including a plurality of inverters coupled between a wordline group decode node, a power supply and the wordline. Overvoltage on the wordline driver and NFETs of the SRAM cell are eliminated by applying a power gating mode and lowering the power supply voltage.

19 Claims, 8 Drawing Sheets

(56) References Cited

U.S. PATENT DOCUMENTS

| | | | |
|---|---|---|---|
| 6,865,119 B2* | 3/2005 | Becker | G11C 11/417 365/154 |
| 6,909,660 B2 | 6/2005 | Oh | |
| 6,992,915 B2 | 1/2006 | Kang et al. | |
| 7,245,548 B2 | 7/2007 | Derner et al. | |
| 7,433,239 B2 | 10/2008 | Nautiyal et al. | |
| 7,447,084 B2 | 11/2008 | Heo et al. | |
| 7,468,903 B2* | 12/2008 | Wang | G11C 8/08 365/154 |
| 7,623,405 B2 | 11/2009 | Lysinger | |
| 7,768,842 B2 | 8/2010 | Hur et al. | |
| 7,929,359 B2 | 4/2011 | Jeong et al. | |
| 8,004,924 B2 | 8/2011 | Leomant et al. | |
| 9,318,162 B2 | 4/2016 | Pilo et al. | |
| 9,679,635 B2 | 6/2017 | Pilo et al. | |
| 9,734,891 B2 | 8/2017 | Pilo et al. | |
| 9,734,892 B2 | 8/2017 | Pilo et al. | |
| 2004/0017711 A1 | 1/2004 | Kang et al. | |
| 2006/0023542 A1 | 2/2006 | Derner et al. | |
| 2006/0146616 A1* | 7/2006 | Heo | G11C 8/08 365/189.09 |
| 2008/0112212 A1* | 5/2008 | Wang | G11C 8/08 365/154 |
| 2008/0198679 A1 | 8/2008 | Lysinger et al. | |
| 2013/0128684 A1 | 5/2013 | Buettner et al. | |
| 2013/0235679 A1 | 9/2013 | Devulapalli | |
| 2016/0086658 A1 | 3/2016 | Pilo et al. | |

OTHER PUBLICATIONS

Kanda, et al. "Two orders of magnitude leakage power reduction of low voltage SRAMs by row-by-row dynamic Vdd control (RRDV) scheme", ASIC/SOC Conference, 2002, Abstract.

List of IBM Patents or Patent Applications Treated as Related 1 page.

Specification and Drawings for "Overvoltage Protection for a Fine Grained Negative Wordline Scheme" for related U.S. Appl. No. 15/797,068, filed Oct. 30, 2017.

* cited by examiner

OVERVOLTAGE PROTECTION FOR A FINE GRAINED NEGATIVE WORDLINE SCHEME

FIELD OF THE INVENTION

The invention relates to semiconductor structures and, more particularly, to overvoltage protection for a fine grained negative wordline scheme for SRAM memories.

BACKGROUND

Static random-access memory (SRAM) is a type of semiconductor memory that uses bistable latching circuitry to store each bit. SRAM exhibits data remanence, but it is still volatile in the conventional sense that data is eventually lost when the memory is not powered. Conventional CMOS SRAM cells typically consist of six transistors: two P channel field effect transistors (PFETs) for a pull-up operation, two N channel field effect transistors (NFETs) for pull down, and two NFETs for input/output (i.e., passgate) access. A conventional SRAM array consists of "m" rows and "n" columns of the aforementioned SRAM cells. Cells of the same row share one word line (WL), while cells of the same column share the same bit line pair, e.g., BL and BR.

An SRAM has three different states: standby (the circuit is idle), reading (the data has been requested) and writing (updating the contents). In the standby mode, if the word line is not asserted, access transistors disconnect the cell from the bit lines; while cross-coupled inverters will continue to reinforce each other as long as they are connected to supply. During standby, all the WLs are at low (i.e., at GND level) and all bit lines are biased to the standby voltage level (of the power supply) Vdd. However, in the standby mode, the SRAM cell can exhibit significant passgate leakage. Also, known SRAM cells can exhibit wordline overvoltage stress when the wordline voltage is negative.

SUMMARY

In an aspect of the invention, a circuit comprises a static random access memory (SRAM) cell comprising at least a wordline coupled to a plurality of NFETs of a transistor array. The circuit further comprises a wordline driver comprising a plurality of inverters coupled between a wordline group decode node, a power supply and the wordline. Overvoltage on the wordline driver and NFETs of the SRAM cell are eliminated by applying a power gating mode and lowering the power supply voltage.

In an aspect of the invention, a circuit comprises a power gating voltage circuit coupled to a power supply line. The circuit further comprises a retention device coupled to the power supply line. The circuit further comprises a wordline driver coupled to a power supply line. The circuit further comprises a wordline pull down network coupled to the power supply line and the wordline driver. The circuit further comprises a static random access memory (SRAM) cell comprising at least a wordline coupled to the wordline driver.

In an aspect of the invention, a method comprises providing a negative voltage to a wordline of an SRAM cell during a power gating mode.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the fine grained negative wordline scheme for SRAM memories, which comprises the structures of the present invention. In still further embodiments, a method in a computer-aided design system is provided for generating a functional design model of the fine grained negative wordline scheme for SRAM memories. The method comprises generating a functional representation of the structural elements of the fine grained negative wordline scheme for SRAM memories.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to a fine grained negative wordline scheme for SRAM memories. More specifically, the present invention is directed to an SRAM with a fine grained negative wordline driver. Accordingly, by using a wordline driver with negative voltage down level, SRAM cell passgate leakage can be significantly reduced. Also, by implementing the present invention, fine grain voltage domain will allow higher leakage savings by powering up only a small section of the array for read/write operations while the rest of the array is still in a retention state. And, the use of the present invention in conjunction with fine grain VCS power gating avoids wordline device overvoltage stress. That is, the present invention tackles the overvoltage issue using a negative wordline scheme without level translators.

In specific embodiments, the fine grained negative wordline scheme for SRAM memories applies a negative supply voltage only to the circuit structure (e.g., wordline) when a positive supply voltage is lowered (e.g., when the power gating is turned on, the supply voltage is lowered). By lowering the positive supply voltage, the large Vds/Vgs/Vgd reliability problem caused by the negative supply voltage is solved. Also, when the power gating is turned off, the negative supply voltage is replaced with a GND (0V) signal. In this way, reliability is still preserved.

Figure 1:
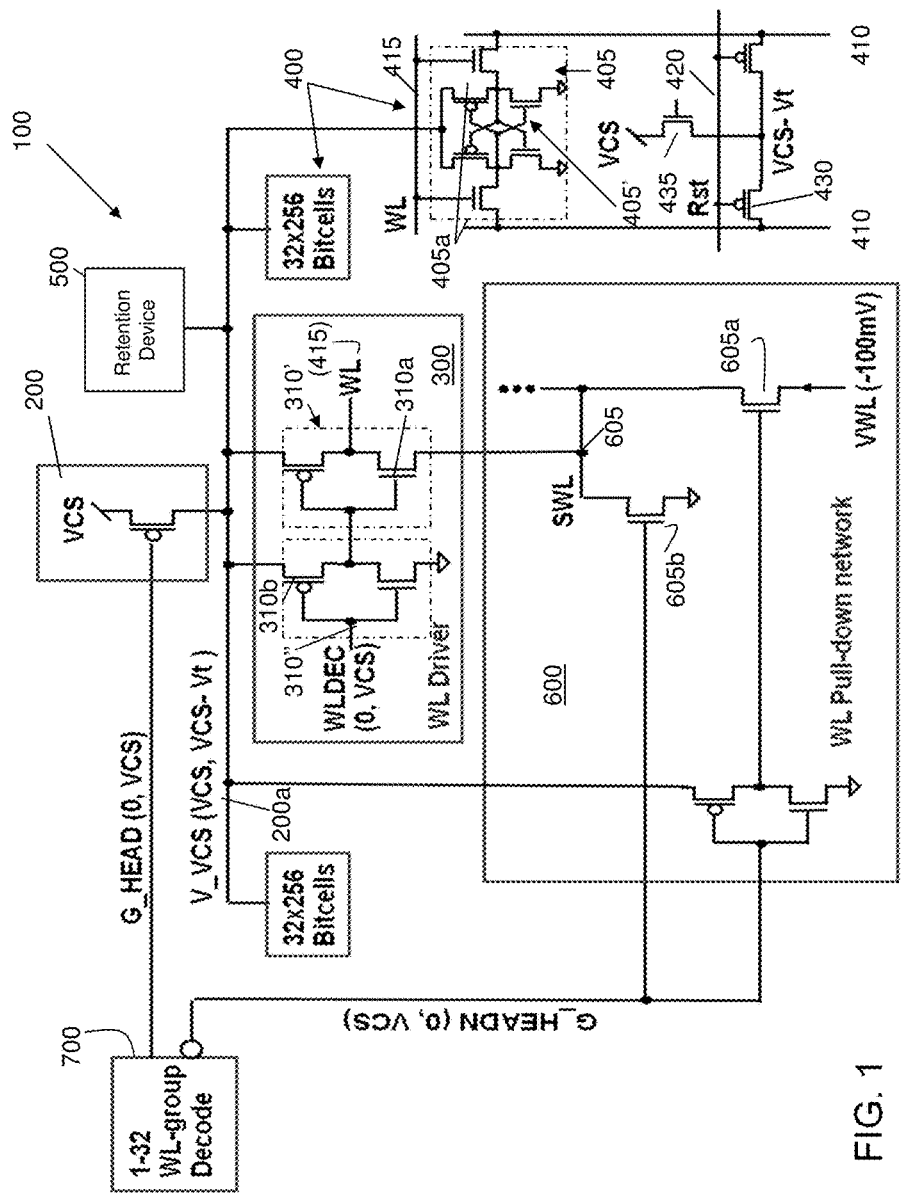
FIG. 1 shows a schematic representation of a fine grained negative wordline scheme for SRAM memories, in accordance with aspects of the present invention.
Figure 8:
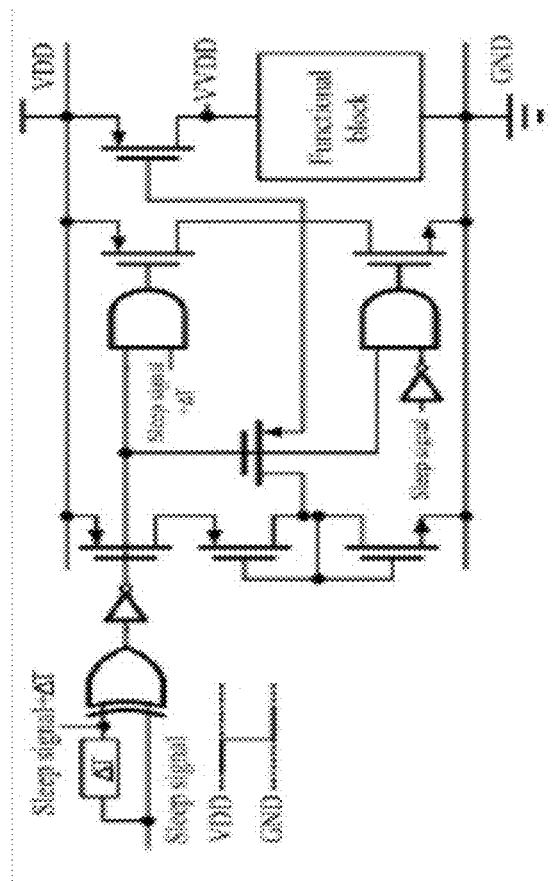
FIG. 8 shows a power gating circuit used in an SRAM memory.

FIG. 1 shows a schematic representation of a fine grained negative wordline (WL) scheme for SRAM memories, in accordance with aspects of the present invention. In particular, the circuitry 100, e.g., WL-based scheme, includes leveraging a VCS power gating circuit (e.g., header) 200 with a wordline driver 300 feeding to a plurality of SRAM cells 400, to reduce the power-supply voltage so that a negative down-level does not require a thick-oxide device, level-shifting or stacked devices with intermediate voltage levels. In embodiments, the VCS power gating circuit 200 is coupled between a word line decode node 700 and a power supply rail 200a. In specific embodiments, the power gating circuit 200 can comprise any conventional circuitry such as that shown in FIG. 8; although other power gating circuitry for SRAM cells is contemplated by the present invention.

As should be understood by those of skill in the art, the SRAM cells 400 include a six transistor array 405 (comprising cross-coupled inverters) with two NFET devices 405a connected between a wordline (WL) 415 and bit lines 410. In the ON state, the NFET devices 405a will be at V_VCS. The SRAM cells 400 further include a readline (Rst) 420 connected to PFET devices 430. The PFET devices 430 are also connected to the bit lines 410. The readline 420 can be charged (VCS-Vt) through the NFET devices 405a, independent of bitline power gating. A four transistor array 405' of the transistor array 405 is coupled to the power supply rail 200a. Also, the bit lines 410 are precharged to VCS-Vt at the end of every clock cycle. This is done by turning the RST signal low at the end of every clock cycle, thereby turning on the PFETs 430 and charging the bit lines 410 to VCS-Vt through the PFETs 430 and the source-follower NFET. In embodiments, the NFET 435 connected between the PFETs 430 should have its gate connected to VCS.

In embodiments, the wordline driver 300 generates the signal of the WL 415, e.g., control the ON-OFF state of the wordline (WL) through use of rail WL-group decode 700. In embodiments, WLDEC and WL-group decode 700 do not have to be the same signal. For example, WL-group decode 700 controls a group of wordline (WL) signals that can range from a group of 1 WL to 32 WL (or an arbitrary number); whereas, WLDEC refers to one specific WL (not a group of WL). In embodiments, the WL 415 will be in the OFF state at 0 V or a negative voltage; whereas, the WL 415 will be in the ON state at VCS. In embodiments, the WL 415 will be at 0V if WL-group decode 700 is selected (e.g. that group of WL has been selected) or WL 415 will be at negative voltage if WL-group decode 700 is not selected (e.g. that group of WL has not been selected).

More specifically, the wordline driver 300 includes two inverters 310' and 310", each of which include an NFET device 310a and a PFET device 310b. The input of the inverter 310" connects to WL-group decode signal (WL-DEC) 700; whereas, the output of the inverter 310' connects to the WL 415. The output of inverter 310" connects to the input of the inverter 310', e.g., the drain region of inverter 310" is connected to the gate region of inverter 310'. The two inverters 310' and 310" are also coupled to the power supply rail (V_VCS) 200a. The power supply rail (V_VCS) 200a is also coupled to the power gating circuit 200, as well as the SRAM cells 400 and retention device 500.

Still referring to FIG. 1, the circuitry 100 further includes the retention device 500 which can lower the supply voltage VCS. In embodiments, the retention device 500 can be a diode connected PFET, which has its gate connected to V_VCS. In this way, the source of the PFET is at VCS and its drain is at V_VCS. In embodiments, the voltage supply VCS can be lowered in the power gating mode using the retention device 500, e.g., by shutting off the header device 200, leakage on V_VCS 200a (caused by the SRAM cells) will cause V_VCS 200a to be lowered until the retention device 500 is able to turn on. Power-up of V_VCS 200a can be performed through header device 200 to change V_VCS to VCS during R/W operations. As described herein, VCS acts as the supply voltage to the SRAM cells 400, e.g., in the ON state, the NFET devices 405a will be at V_VCS.

The circuitry 100 further includes a WL pull down network 600. In embodiments, the wordline pull down network 600 is coupled to the power supply line 200a. In further embodiments, the NFET device 310a of inverter 310' is coupled to SWL node 605 of the WL pull down network 600 for effectuating operations of the WL line 415. In embodiments, the WL pull down network 600 further includes FETs (NFET devices) 605a and 605b, which can be controlled to eliminate the overvoltage issue, e.g., lowering VCS to VCS-Vt. For example, in embodiments, the WL pull down network 600 connects the VCS terminal to the WL pull-down device upon selection of the fine-grained power gated domain. Also, the WL pull down network 600 connects the negative voltage WL supply to the WL pull-down device when the fine-grained partition is unselected in the retention mode.

In embodiments, NFET 605a is responsible for letting or not letting a negative voltage pass onto node SWL. NFET 605b, on the other hand, is responsible for letting or not letting GND (0V) pass onto node SWL. If 700 is not asserted (i.e. in retention state), then NFET 605a is turned on (and NFET 605b is turned off) and a negative voltage is passed onto SWL and onto the source of NFET 310a of the WL Driver 300. If WL-group decode 700 is asserted (i.e., powered up state), then NFET 605b is turned on (and NFET 605a is turned off) and GND (0V) is passed onto SWL and onto the source of NFET 310a of the WL Driver 300, for example.

Figure 2:
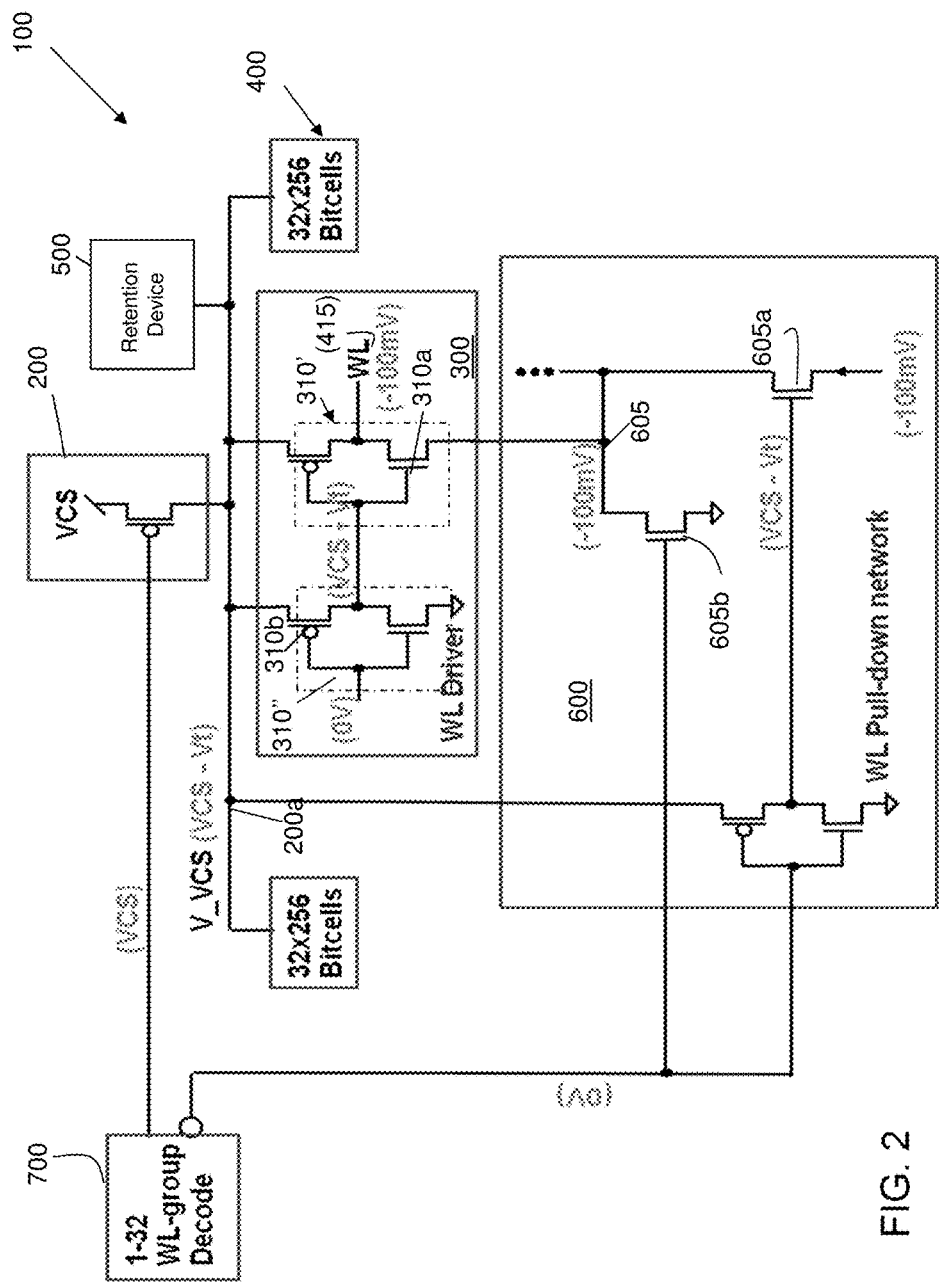
FIG. 2 shows a schematic representation of a fine grained negative wordline scheme for SRAM memories in a retention state, in accordance with aspects of the present invention.

FIG. 2 shows a schematic representation of a fine grained negative wordline scheme for SRAM memories in a retention state (power gating mode), in accordance with aspects of the present invention. In the retention state, PFET 310b of inverter 310" will be ON, thereby passing V_VCS (which is at VCS-Vt) onto the input of inverter 310', which turns on NFET 310a of inverter 310'. NFET 605a of the WL pull down network 600 will be ON (e.g. the gate voltage of NFET 605a will be at VCS-Vt). Also, the NFET 605b will be at 0 V (e.g., turned OFF). In this way, the voltage (−100 mV) of the WL pull down network 600 will pass to the WL 415 through the NFETs 605a, node 605 and NFET 310a of the inverter 310'. In embodiments, the voltage (−100 mV or 0V) of the WL pull down network 600 will be controlled by G_HEADN. In this way, the power gating scheme reduces the supply voltage when the wordline is inactive (at a negative voltage) in order to eliminate the overvoltage on a negative wordline driver.

Figure 3:
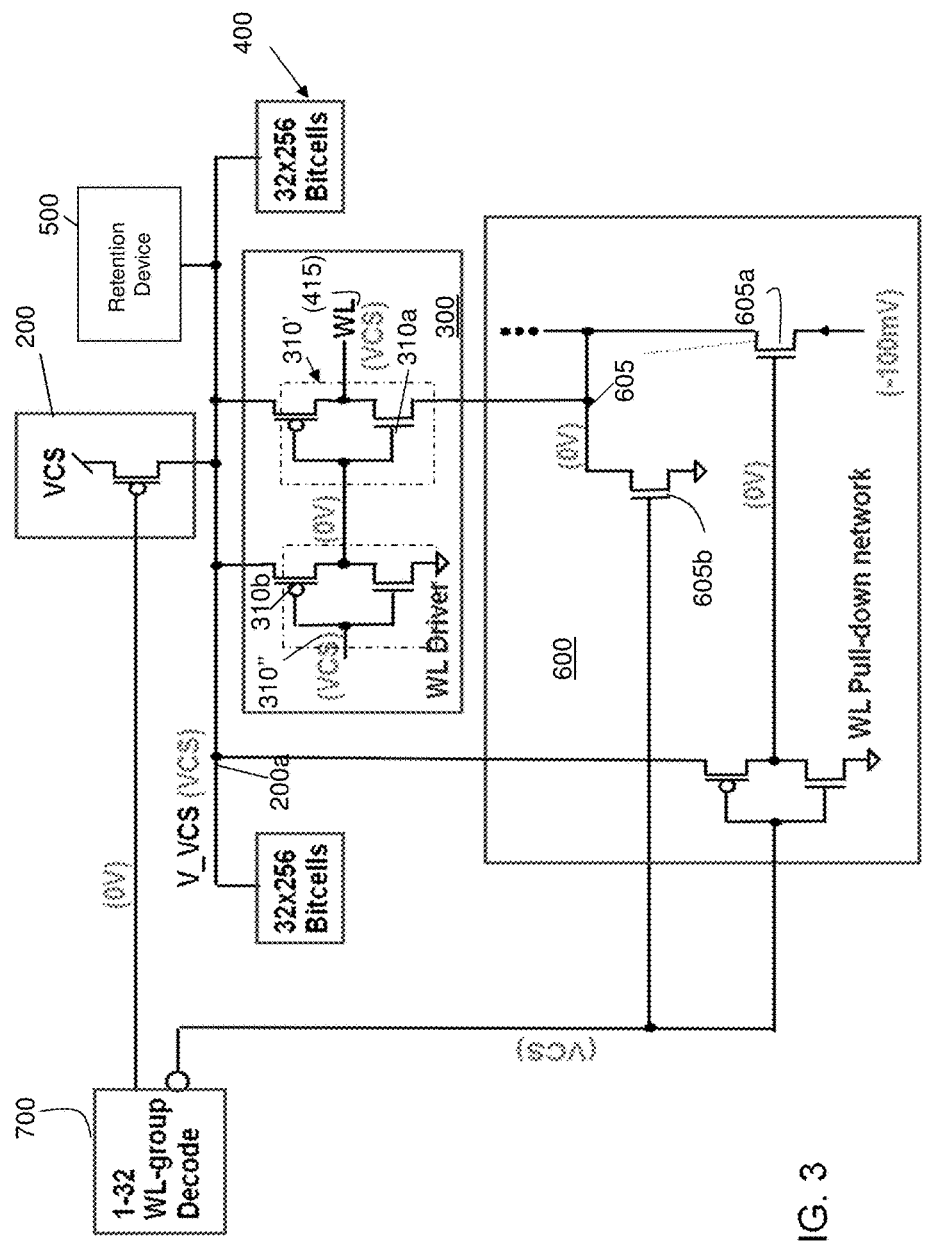
FIG. 3 shows a schematic representation of a fine grained negative wordline scheme for SRAM memories in a powered up state with selected wordline, in accordance with aspects of the present invention.

FIG. 3 shows a schematic representation of a fine grained negative wordline scheme for SRAM memories in a powered up state with selected wordline, in accordance with aspects of the present invention. In the powered up state with selected wordline, PFET 310b of inverter 310" of the wordline driver 300 will be OFF, and NFET 310a of inverter 310' of the wordline driver 300 and NFET 605a of the WL pull down network 600 will be OFF. These states are controlled by 0 V. Also, the NFET 605b will be at VCS, passing 0V onto node 605. In this way, GND or 0V is at the input of inverter 310' which turns on PFET 310b of inverter 310' which passes V_VCS (which is at VCS) onto WL 415 with no overvoltage problems.

Figure 4:
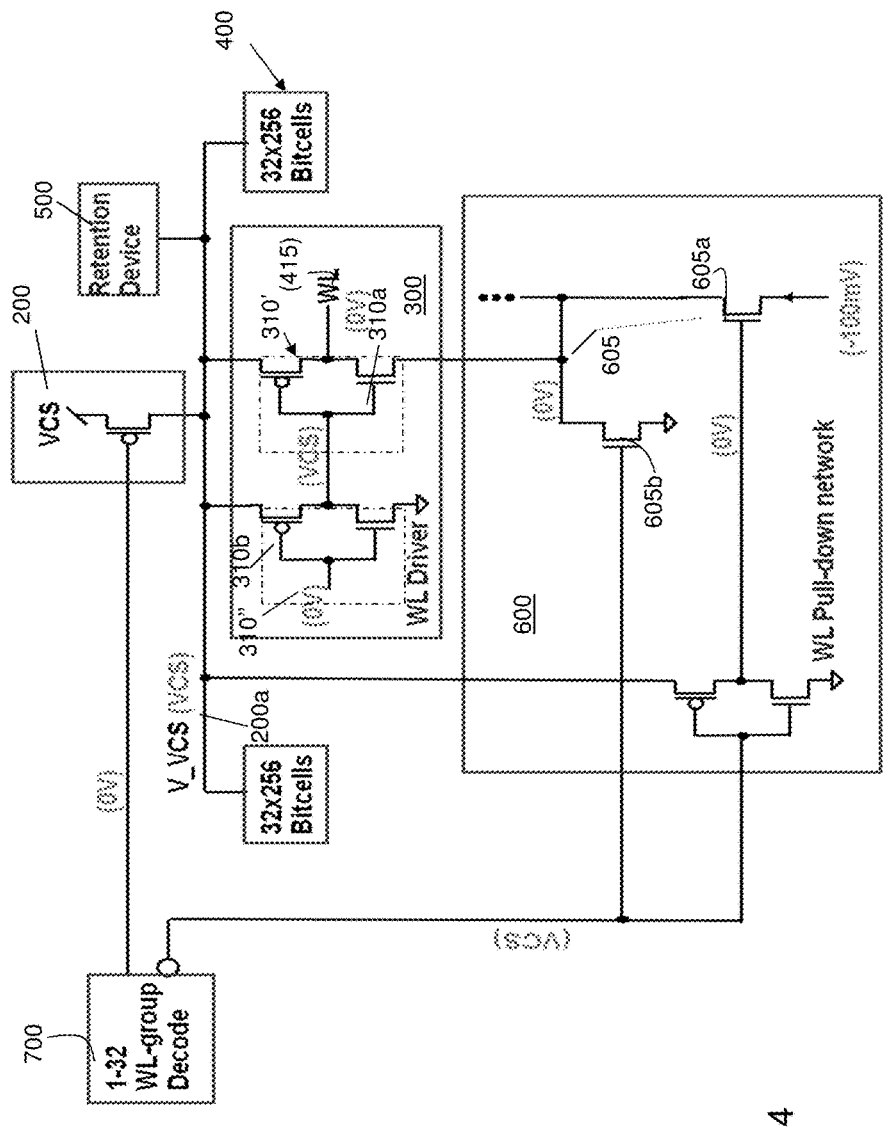
FIG. 4 shows a schematic representation of a fine grained negative wordline scheme for SRAM memories in a powered up state with unselected wordline, in accordance with aspects of the present invention.

FIG. 4 shows a schematic representation of a fine grained negative wordline scheme for SRAM memories in a powered up state with unselected wordline, in accordance with aspects of the present invention. In the powered up state with unselected wordline, PFET 310b of inverter 310" of wordline driver 300 will be ON, and V_VCS (which is at VCS) will be passed onto the gate of inverter 310'. The NFET 310a of inverter 310' of the wordline driver 300 will be ON (gate voltage will be at VCS). On the other hand, the NFET 605a of the WL pull down network 600 will be OFF and the NFET 605b of the WL pull down network 600 will be ON, feeding to GND. In this way, 0 V is feed from the NFET device 605b of the wordline pull down network 300 through the NFET device 310a of the inverter 310' to the wordline 415 with no overvoltage problems.

In the power gating (retention) mode, the diode connected PFET (e.g., retention device 500) will turn ON and the header device 200 will turn OFF. Leakage from the SRAM cells will cause V_VCS to fall until the diode connected PFET (retention device 500) turns on (due to the difference of voltage between the source and gate of the diode connected PFET) which ultimately keeps the V_VCS supply voltage to be at VCS-$V_t$. As should be understood by those of skill in the art, applying VCS-$V_t$ on the WL Driver 300, WL Pull-down network 600 and SRAM cell 400 will eliminate the overvoltage problem. In the power gating mode, e.g., retention state, (i) the WL is a negative voltage (−100 mV) and hence turned OFF, (ii) voltage of G_HEAD is high and (iii) voltage of G_HEADN is 0 or low. In the R/W mode, VCS, will act as the supply voltage to the WL Driver 300, WL Pull-down network 600 and SRAM cell 400. That is, when G_HEAD is 0 or low, the circuitry is in the power up R/W mode (and no longer in the power gating mode).

Figure 5:
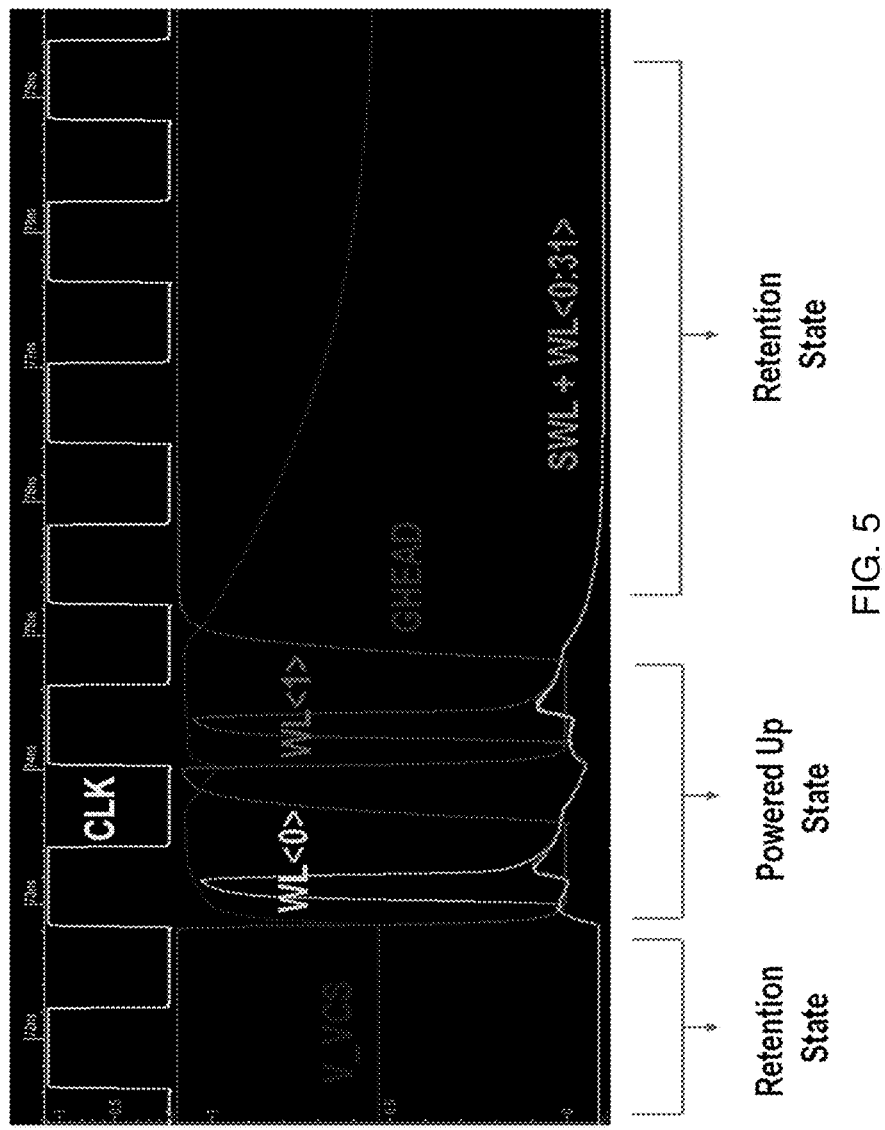
FIG. 5 shows a waveform diagram of a fine grained negative wordline scheme for SRAM memories, in accordance with aspects of the present invention.

FIG. 5 shows a waveform diagram of a fine grained negative wordline scheme for SRAM memories, in accordance with aspects of the present invention. As shown in the waveform diagram of FIG. 5, in the retention state (power gating state), the WL is a negative voltage due to the lowered value of V_VCS. This will eliminate the overvoltage issue on any of the NFET devices of the circuit 100. In the powered up state, e.g., R/W operations, the voltage of the WL will increase. In the next retention state, the WL will again be brought down to a negative voltage, e.g., since V_VCS goes back down to a lower voltage. Accordingly, by implementing the present invention, the negative WL-based scheme saves more SRAM passgate leakage with a much reduced voltage swing (negative Vgs vs. reduced Vds).

Figure 6:
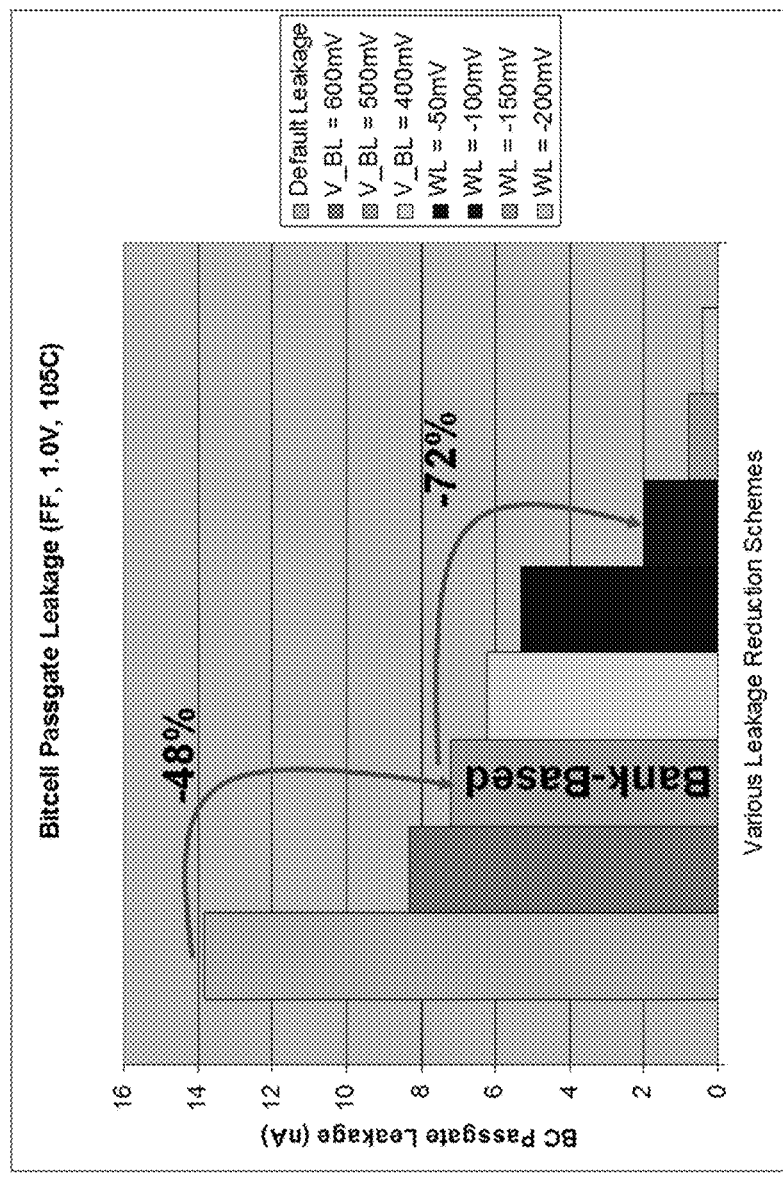
FIG. 6 shows a graph of effects of negative Vgs vs. Vd reduction on leakage.

FIG. 6 shows a graph of effects of negative Vgs vs. Vds reduction on leakage. As shown in FIG. 6, total leakage reduction is improved by up to 72%, compared to a conventional system.

Figure 7:
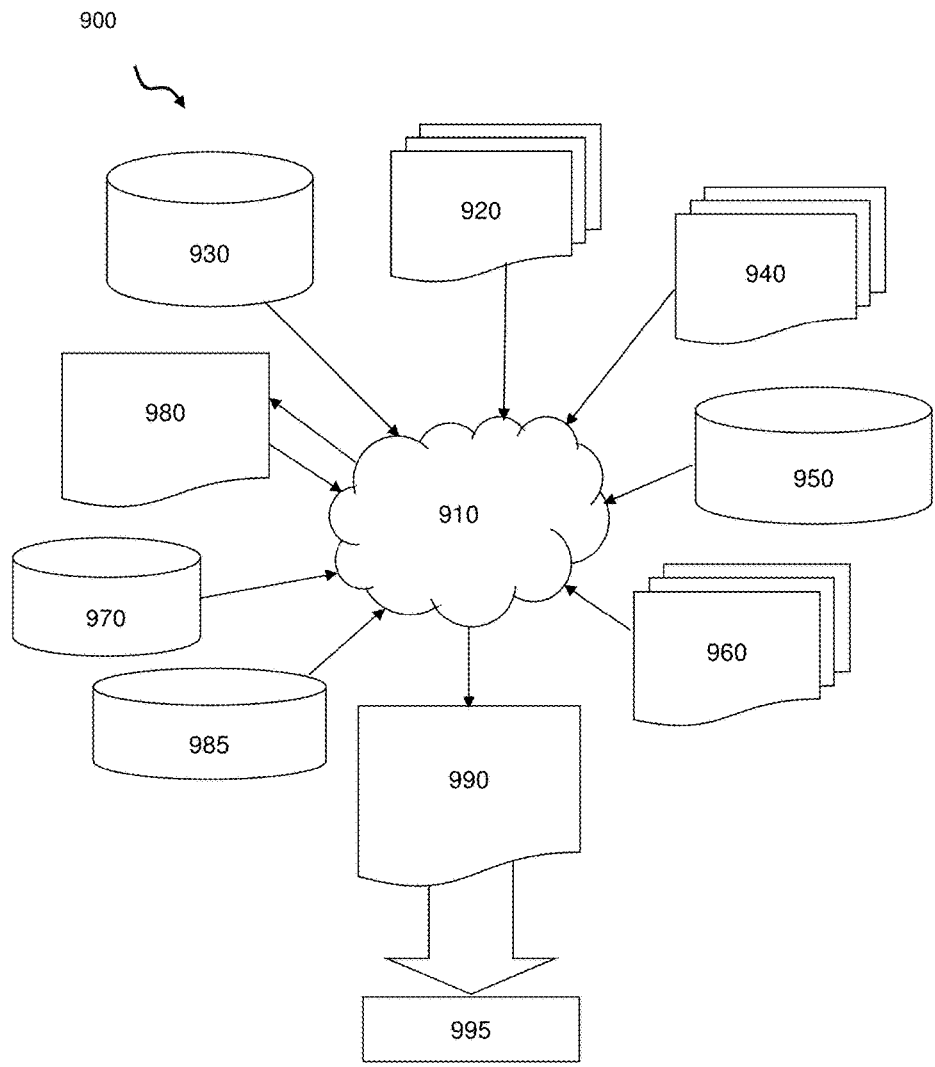
FIG. 7 is a flow diagram of a design process used in semiconductor design, manufacture, and/or test.

FIG. 7 is a flow diagram of a design process used in semiconductor design, manufacture, and/or test. FIG. 7 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-4 and 8. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-4 and 8. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-4 and 8 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-4 and 8. In one embodiment, design structure 990 may comprise a compiled, executable HDL simulation model that functionally simulates the devices shown in FIGS. 1-4 and 8.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-4 and 8. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising providing a negative voltage to a wordline of an SRAM cell during a power gating mode, wherein a wordline pulldown network is coupled to a wordline group decode node to control operation of a first control device of the wordline pulldown network for allowing or preventing the negative voltage from passing to a node of the wordline pulldown network, and wherein the negative voltage is only applied to the wordline when a positive supply voltage is lowered.

2. The method of claim 1, further comprising passing 0 or higher voltage to the wordline of the SRAM cell during a powering up state.

3. The method of claim 1, further comprising a wordline driver, wherein the wordline driver and the SRAM are coupled to a power gating voltage circuit.

4. The method of claim 1, further comprising a wordline driver which includes an inverter coupled to a power gating voltage circuit and to the wordline.

5. The method of claim 4, wherein the inverter is comprised of an NFET and a PFET having source-drain paths coupled to one another and coupled to the power gating voltage circuit, wherein a node between the source-drain paths of the NFET and the PFET is coupled to the wordline.

6. A method comprising providing a negative voltage to a wordline of an SRAM cell during a power gating mode, wherein a wordline pulldown network is coupled to a wordline group decode node to control operation of a first control device of the wordline pulldown network for allowing or preventing the negative voltage from passing to a node of the wordline pulldown network, wherein the negative voltage is only applied to the wordline when power gating is turned on.

7. The method of claim 6, wherein, when the power gating is turned off, the negative voltage is replaced with a GND (0V) signal.

8. The method of claim 7, further comprising allowing or preventing the GND (0V) signal from passing to the node of the wordline pulldown network by a second control device in the wordline pulldown network.

9. The method of claim 8, wherein the first control device comprises a first NFET device of the wordline pulldown network.

10. The method of claim 9, wherein the second control device comprises a second NFET device of the wordline pulldown network.

11. The method of claim 8, wherein control terminals of the first control device and the second control device are both coupled to be controlled by the wordline group decode node.

12. The method of claim 11, wherein the control terminal of the first control device is coupled directly to the wordline group decode node and the control terminal of the second control device is coupled to the wordline group decode node through an inverter.

13. The method of claim 12, wherein the first control device comprises a first NFET device of the wordline pulldown network and the second control device comprises a second NFET device of the wordline pulldown network.

14. A method comprising providing a negative voltage to a wordline of an SRAM cell during a power gating mode, wherein a wordline pulldown network is coupled to a wordline group decode node to control operation of a first control device of the wordline pulldown network for allowing or preventing the negative voltage from passing to a node of the wordline pulldown network, further comprising a wordline driver, wherein the wordline driver and the SRAM are coupled to a power gating voltage circuit, wherein the power gating voltage circuit is comprised of a FET, and wherein a control gate of the FET of the power gating voltage circuit is coupled to the wordline group decode node.

15. The method of claim 14, wherein the FET of the power gating voltage circuit is a PFET.

16. The method of claim 14, wherein a source-drain path of the FET is configured to connect the wordline driver and the SRAM to a power supply line, and wherein the negative voltage is only applied to the wordline when a positive supply voltage is lowered.

17. The method of claim 14, wherein a source-drain path of the FET is configured to connect the wordline driver and the SRAM to a power supply line, and wherein the negative voltage is only applied to the wordline when power gating is turned on.

18. A method comprising providing a negative voltage to a wordline of an SRAM cell during a power gating mode, wherein a wordline pulldown network is coupled to a wordline group decode node to control operation of a first control device of the wordline pulldown network for allowing or preventing the negative voltage from passing to a node of the wordline pulldown network, wherein:
  the negative voltage is applied to the wordline to eliminate an overvoltage on an NFET device coupled to the wordline of the SRAM, and
  a wordline driver is coupled to the wordline and to the node of the wordline pulldown network.

19. The method of claim 18, wherein a gate of the NFET device of the SRAM is coupled to the wordline to receive the negative voltage from the wordline driver.

* * * * *